United States Patent [19]
Kim et al.

[11] Patent Number: 5,504,756
[45] Date of Patent: Apr. 2, 1996

[54] METHOD AND APPARATUS FOR MULTI-FREQUENCY, MULTI-PHASE SCAN CHAIN

[75] Inventors: Kee S. Kim, Folsom, Calif.; Leonard J. Schultz, Hillsboro, Oreg.

[73] Assignee: Intel Corporation, Santa Clara, Calif.

[21] Appl. No.: 129,274

[22] Filed: Sep. 30, 1993

[51] Int. Cl.⁶ .................................................. G01R 31/317
[52] U.S. Cl. .......................................... 371/22.3; 324/73.1
[58] Field of Search ................................... 371/22.3, 22.1; 364/490, 580; 340/825.86, 825.87; 324/73.1, 158 R; 377/28, 54, 59, 73

[56] References Cited

U.S. PATENT DOCUMENTS

| | | | |
|---|---|---|---|
| 4,860,290 | 8/1989 | Daniels et al. | 371/22.3 |
| 4,947,357 | 8/1990 | Stewart et al. | 371/22.3 |
| 4,996,691 | 2/1991 | Wilcox et al. | 371/68.1 |
| 5,008,618 | 4/1991 | Van Der Stat | 371/22.3 |
| 5,285,153 | 2/1994 | Ahanin et al. | 324/73.1 |

Primary Examiner—Ellis B. Ramirez
Assistant Examiner—Thomas Peeso
Attorney, Agent, or Firm—Blakely, Sokoloff, Taylor & Zafman

[57] ABSTRACT

A scan chain for testing sequential logic circuitry includes a number of concatenated storage elements having a feedback loop from the output of the last storage element to the input of the first storage element. The storage elements are clocked by a chain clock signal at a frequency multiple of a base frequency. The number of storage elements in the scan chain is a relative prime with respect to the frequency multiple. Scan chains running at different frequency multiples of the base frequency may be concatenated with the output of the last storage element of one scan chain being coupled to the input of the first storage element of the next scan chain. Wherever the output of a storage element clocked on a leading phase of the chain clock signal is coupled to the input of a storage element clocked on a trailing phase of the chain clock signal, a buffer is inserted to buffer the output to the input.

18 Claims, 9 Drawing Sheets

| BASE FREQ CYCLE(J) | N-FREQ CYCLE (K) | LC | SI | FF4 | FF3 | FF2 | FF1 | FF0 | SO |
|---|---|---|---|---|---|---|---|---|---|
| 0 | 0 | 1 | a | E | D | C | B | A | A |
|   | 1 | 0 |   | a | E | D | C | B |   |
| 1 | 2 | 1 | b | B | a | E | D | C | C |
|   | 3 | 0 |   | b | B | a | E | D |   |
| 2 | 4 | 1 | c | D | b | B | a | E | E |
|   | 5 | 0 |   | c | D | b | B | a |   |
| 3 | 6 | 1 | d | a | c | D | b | B | B |
|   | 7 | 0 |   | d | a | c | D | b |   |
| 4 | 8 | 1 | e | b | d | a | c | D | D |
|   | 9 | 0 |   | e | b | d | a | c |   |
| 5 | 10 | x | x | c | e | b | d | a | a |
|   | 11 | 0 |   | x | c | e | b | d |   |
| 6 | 12 | x | x | d | x | c | e | b | b |
|   | 13 | 0 |   | x | d | x | c | e |   |
| 7 | 14 | x | x | e | x | d | x | c | c |
|   | 15 | 0 |   | x | e | x | d | x |   |
| 8 | 16 | x | x | x | x | e | x | d | d |
|   | 17 | 0 |   | d | x | x | e | x |   |
| 9 | 18 | x | x | x | d | x | x | e | e | x = DON'T CARE STATE 5,504,756

METHOD AND APPARATUS FOR MULTI-FREQUENCY, MULTI-PHASE SCAN CHAIN

BACKGROUND OF THE INVENTION

1. Field of the Invention

The present invention relates to the field of circuit testing, and more particularly, to the testing of sequential logic circuits using a single scan chain of sequential elements clocked at different frequencies and phases.

2. Art Background

Many problems are encountered in testing logic circuits having sequential components. For a solely combinational logic circuit, testing is relatively simple. A circuit tester can easily apply all possible combinations of input states and observe the resulting output states. However, because of the temporal complications introduced by sequential components, it is very difficult to determine what inputs are necessary to place the sequential logic into a given state, and to observe the storage element contents.

FIG. 1 illustrates a commonly used model of a combined sequential/combinational logic circuit. The combinational logic circuit is represented by a block 102 having inputs and outputs connected to sequential elements (flip-flops) 104. This model recognizes that different sections of the circuitry may be running at different clock frequencies. For example, microprocessors manufactured by Intel Corporation, the Assignee of the present invention, include an internal core running two or three times as fast as a peripheral clock. Similarly, some communication chips interface between different signals running at different frequencies, requiring one part of the chip to run at a slow clock while another part runs at a faster clock.

FIG. 2 illustrates a configuration for testing the circuit of FIG. 1 using scan chain techniques. Multiplexers 202 are used to select between a normal mode and a scan mode. In normal mode, the flip-flops 104 are allowed to operate as they normally would in conjunction with the combinational logic circuit 102. In scan mode, the flip-flops 104 are divided into separate scan chains for each clock frequency. In FIG. 2, the first scan chain runs at a clock frequency CLOCK1, and the second scan chain runs at a clock frequency CLOCK2. Bit patterns are applied to scan inputs SI1 and SI2, respectively, to sequentially set the state of the scan chains. The state of the flip-flops 104 is sequentially read out through scan outputs SO1 and SO2.

Note that by using the topology of FIG. 2, it is impossible to combine sequential circuits running at different clock frequencies in a single scan chain. For example, assume that the output SO1 of the first scan chain is fed into the input SI2 of the second scan chain. Further assume that the CLOCK2 frequency is three times the CLOCK1 frequency. Thus, in one CLOCK1 clock cycle the output of the last flip-flop in the first scan chain would be clocked into the first three flip-flops of the second scan chain because the second chain is running at three times the frequency of the first scan chain. Accordingly, it would be impossible to set the chain of flip-flops running at the CLOCK2 frequency to an arbitrary state if all sequential circuitry is combined in the same scan chain.

A drawback of the separate scan chain design lies in the fact that scanning in an arbitrary state is awkward and somewhat complex. As another example, assume that the first scan chain consists of ten flip-flops while the second scan chain consists of 100 flip-flops running at twice the first clock frequency. To set the state of the second scan chain, 100 bits must be fed in at the double frequency during 100 clock cycles. In real time, the first scan chain will go through only fifty clock cycles during this time period. To insure that the desired state results in the first scan chain at the same time as the second scan chain, forty dummy bits must be loaded into the first scan chain, followed by ten actual test bits. In this complicated fashion, the scan chain is set to an arbitrary state.

Scan chains also exhibit problems due to dock phase transitions. If a flip-flop is clocked on a leading edge and its output is fed into a flip-flop clocked on a trailing edge, data will be lost as it is shifted out of the first flip-flop, as will be shown below.

Accordingly, it is desired to provide a single scan chain for controlling and observing the state of a sequential logic circuit having sequential elements running at different frequencies and phases.

SUMMARY OF THE INVENTION

The present invention provides a method and apparatus for a multi-frequency, multi-phase scan chain for testing sequential logic circuitry. The scan chain includes a number ($M_1$) of concatenated storage elements. Each storage element is docked by a chain dock signal at a frequency multiple $N_1$ of a base frequency. An output of each of the first $M_1$-1 storage elements is coupled to an input of a corresponding next storage element. An output of a last storage element is coupled to an input of a first storage element, where $M_1$ and $N_1$ are relative primes. The state of the scan chain is observed at the output of the last storage element every base frequency cycle.

The scan chain is coupled to a combinational logic circuit having a number of combinational inputs and outputs. The scan chain further comprises a number ($M_1$) of scan mode multiplexers. Each scan mode multiplexer has a first input coupled to a corresponding combinational output. Each of the last $M_1$-1 scan mode multiplexers further includes a second input coupled to the output of a previous storage element. Each scan mode multiplexer also has an output coupled to the input of a corresponding next storage element. The second input of a first scan mode multiplexer is coupled to the output of the last storage element. The output of each storage element is also coupled to a corresponding combinational input. Each of the last $M_1$-1 scan mode multiplexers selectively couples either the corresponding combinational output or the output of the previous storage element to the input of the corresponding next storage element, and the first scan mode multiplexer selectively couples either the corresponding combinational output or the output of the last storage element to the input of the first storage element.

The scan chain also has an input multiplexer having a data input and a feedback input. The feedback input is coupled to the last storage element. The data input may receive at least one test bit for setting the state of at least one storage element. The input multiplexer further has an output coupled to the second input of the first scan mode multiplexer. The input multiplexer selectively couples the second input of the first scan mode multiplexer to either the data input or the output of the last storage element.

The scan chains may be concatenated with the output of the last storage element of each scan chain being coupled to the data input of the input multiplexer of the next scan chain. Each scan chain in the concatenated string of scan chains is clocked by a frequency multiple of the base frequency, the number of storage elements in each scan chain being a relative prime with respect to the frequency multiple at which the scan chain is running.

Wherever the output of a storage element clocked on a leading phase of the chain clock signal is coupled to the input of a storage element clocked on a trailing phase of the chain clock signal, a buffer is inserted to buffer the transfer of the output to the input.

BRIEF DESCRIPTION OF THE DRAWINGS

The objects, features and advantages of the present invention will become apparent from the following detailed description of the present invention in which:

FIG. 9b illustrates a timing chart of the module of FIG. 9a.

FIG. 10b is a timing chart of the module of FIG. 10a.

DETAILED DESCRIPTION OF THE INVENTION

The present invention provides a method and apparatus for a multi-frequency, multi-phase scan chain. For purposes of explanation, specific embodiments are set forth to provide a thorough understanding of the present invention. However, it will be apparent to one skilled in the art that the invention may be practiced without these details. In other instances, well known elements, devices, process steps and the like are not set forth in detail in order to avoid unnecessarily obscuring the present invention.

Figure 3:
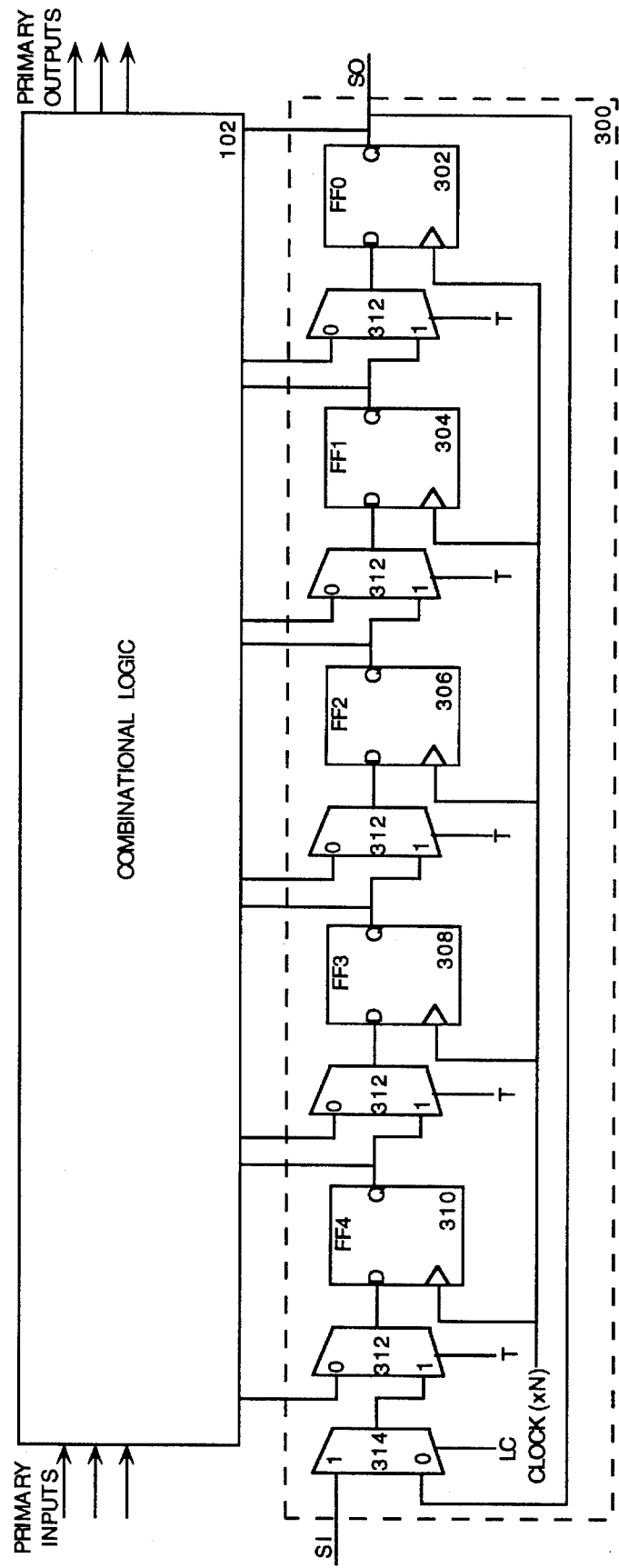
FIG. 3 illustrates the scan chain module of the present invention.

FIG. 3 illustrates a base module 300 of the scan chain of the present invention. The scan chain for a logic circuit may incorporate a number of these modules concatenated together in a single scan chain. The circuit requires a separate module for each clock frequency used by the sequential components.

Any sequential circuit may be represented by a group of flip-flops, each group running at some multiple of a base frequency. The module 300 of FIG. 3 is a scan chain segment for sequential circuitry running off of an N-frequency clock, i.e., a clock running at N times base frequency. As will be shown below, a unique feature of the scan chain module of the present invention is that data may be written into and read out of each module at base frequency even though the sequential elements themselves are running at a multiple of base frequency.

The module 300 includes a series of flip-flops FF0 302, FF1 304, FF2 306, FF3 308 and FF4 310 that are connected by a feedback loop from the output of the last flip-flop 302 to the input of the first flip-flop 310. Five flip-flops are used in this example for illustration purposes. Each flip-flop is clocked by an N-frequency clock. A novel feature of this invention is that each module may include any number of flip-flops as long as the clock multiplication factor N and the number of flip-flops (denoted here by "M") connected by feedback are relative primes, i.e., M and N do not share a common divisor.

The data input to each flip-flop is controlled by a multiplexer 312, which selects between normal and scan modes. The module 300 of the present invention also includes a multiplexer 314 for selecting as an input to the scan chain either an external scan input SI or the feedback input FB running from the output of the last flip-flop 302 in the chain to the input of the first flip-flop 310.

A circuit tester will generally use the scan chain of the present invention for three purposes. First, the tester may test the integrity of the sequential elements themselves by writing a test pattern into the stored elements and then reading them out immediately thereafter. Second, the tester may scan in an arbitrary state into the sequential elements, and then run both the combinational and sequential sections of the circuit together in normal mode. Third, the tester may read the state of the sequential components after the circuit has operated on the arbitrary input in normal mode for one or more base frequency clock cycles.

The operation of module 300 will now be explained with reference to FIG. 4. For illustrative purposes, N=2 for this example. Let A, B, C, D and E represent the bits stored in flip-flops 302, 304, 306, 308 and 310, respectively, at initial clock cycle 0. In this state, bit A, the output of flip-flop 302, is observed at the scan output SO. The scan enable T is set to one to cause the circuit to operate in scan mode. The loop control (LC) is asserted high to select the scan input SI as the input to the scan chain. In this example, at the active edge of the N-frequency clock cycle K=1, an arbitrary test bit a is scanned into flip-flop 310, while the bits in subsequent flip-flops are shifted one flip-flop to the right.

At clock cycle K=1, the loop control LC is deasserted to allow the scan chain to operate in feedback mode. As can be seen from the chart of FIG. 4, bit B is fed back to flip-flop 310 and the input test bit a is shifted to the next flip-flop 308 at the next active edge of the clock at cycle K=2. At this cycle, which corresponds to base frequency cycle J=1, the bit C, which was originally stored in flip-flop 306, is presented at the scan output SO. (The scan output is illustrated only every Nth cycle in this chart for the sake of clarity.) At double frequency cycle K=2, the loop control LC is set to one to permit bit b to sit at the input of flip-flop 310. At the active edge of cycle K=3, bit b is shifted into flip-flop 310 and the other bits shift to the right accordingly. Bit C need not be fed back because it has already been read out.

This process continues until base frequency cycle J=4, at which time all five bits stored in the five flip-flops have been read out from the scan chain module 300 at base frequency. Although these bits were placed in the flip-flops in the order A, B, C, D and E, they are read out in the order A, C, E, B and D. Where M is the number of flip-flops in the base module, N is the frequency of the base module with respect to the base frequency, J is the base frequency clock cycle, and k identifies the flip-flops from last in the chain to first in the chain (k=0, 1, 2, ...), the original order of the bits read out sequentially at the scan chain output may be determined according to the following output ordering equation:

$$SO_J = FF_{kNmodM} \quad (1)$$

In this example, $SO_0 = A = FF_0$
$SO_1 = C = FF_{2mod5} = FF_2$
$SO_2 = E = FF_{(2)(2)mod5} = FF_4$
$SO_3 = B = FF_{(3)(2)mod5} = FF_{6mod5} = FF_1$
$SO_4 = D = FF_{(4)(2)mod5} = FF_3$ Thus, the base module 300 of the present invention permits the state of the sequential components to be determined through a serial output. In this example, note that because M=5 is a relative prime with respect to N=2, none of the original state bits or the input bits are overwritten or otherwise lost in the shifting process.

The above example demonstrates that although the sequential components are running at twice base frequency, the state of the components may be read out at base frequency. The determination of the state of the sequential elements based upon the sequential output is known as the "scan out" implementation. The reading of the state is independent of the input. Note that this scan out implementation is itself a unique feature of the present invention. The present invention may be set up for scan out purposes alone by eliminating multiplexer 314 and connecting the output of flip-flop 302 directly to the scan input of multiplexer 312.

Figures 1, 4:
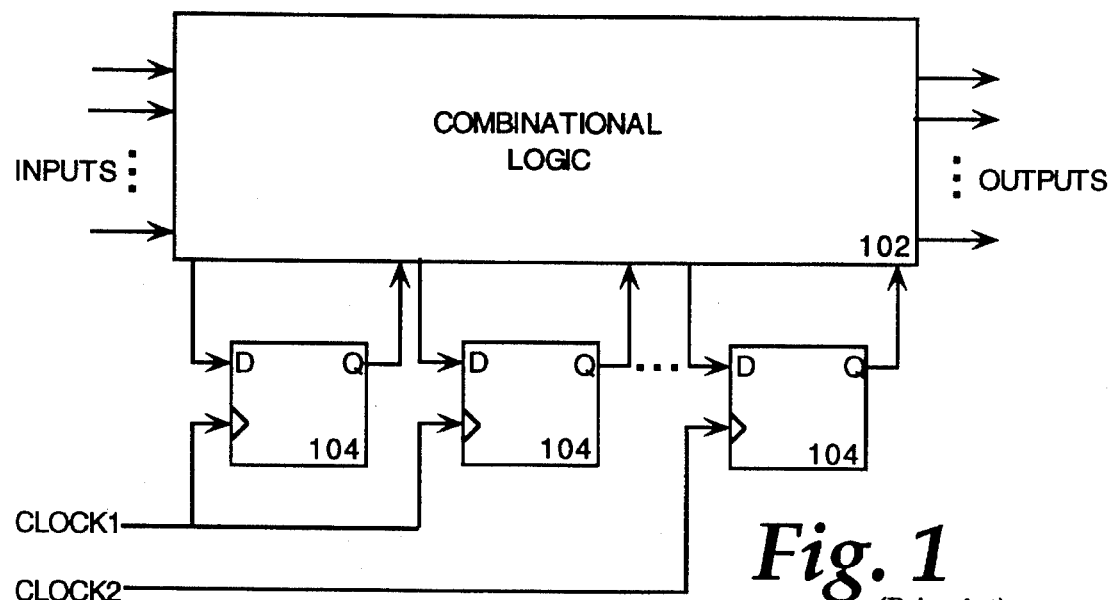
FIG. 1 illustrates a commonly used model of a combined sequential/combinational logic circuit.
FIG. 4 is a timing chart of the module of FIG. 3.
Figure 2:
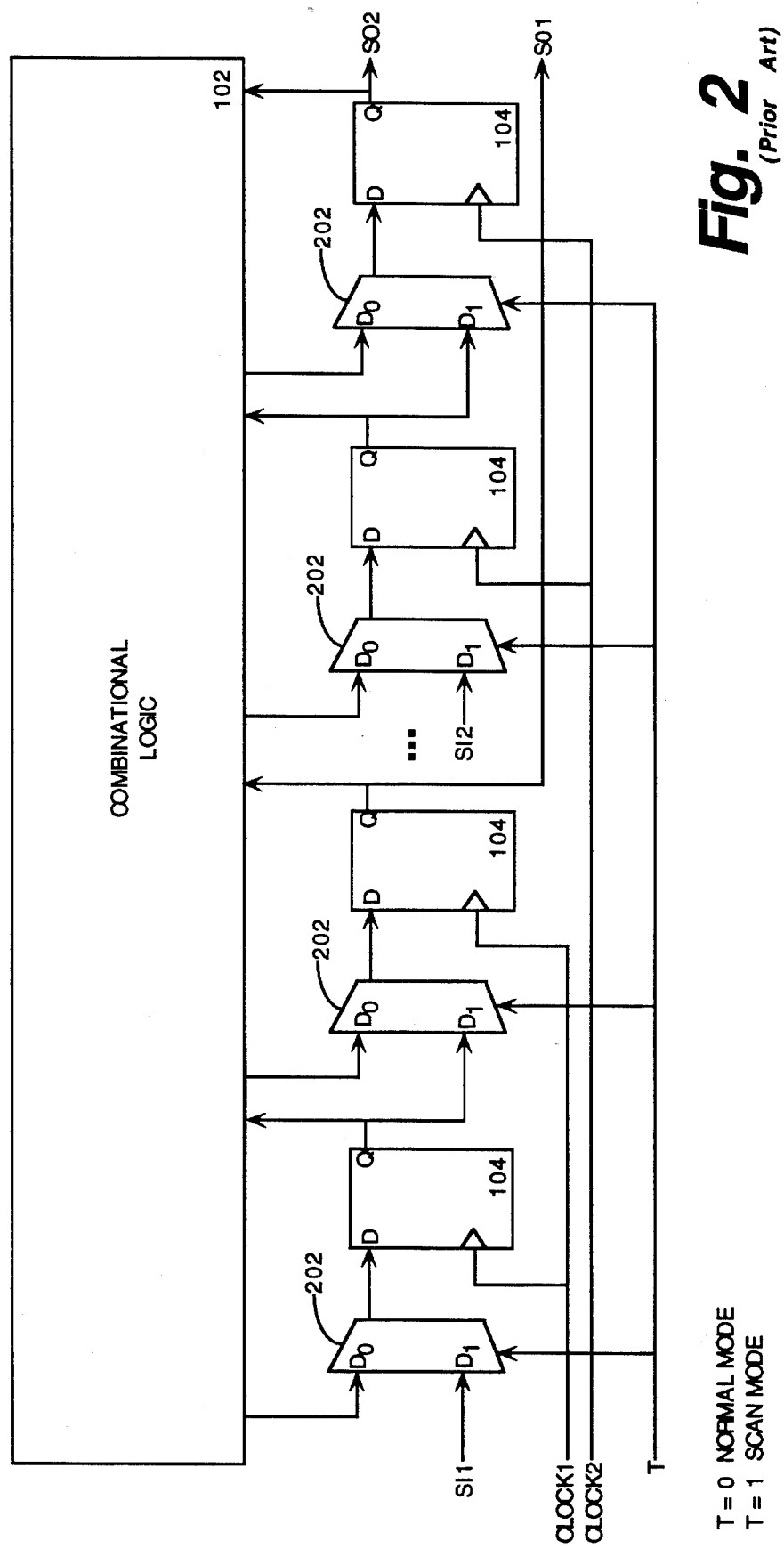
FIG. 2 illustrates a conventional configuration for testing the circuit of FIG. 1.

The chart of FIG. 4 demonstrates not only the ability to read out the state of the flip-flops, but also to scan an arbitrary state into the flip-flops. At base frequency clock cycle J=M, the ordering of the input bits $SI_J$ in the flip-flops may be determined according to the input ordering equation:

$$SI_J = FF_{JNmodM} \quad (2)$$

After an arbitrary state has been scanned into the base module 300, the circuit may be switched into normal mode (T=0) for one or more base frequency clock cycles. Thereafter, the resulting state of the flip-flops in the module 300 may be read out using the scan out implementation described above.

If the base module 300 is not switched into normal mode after scanning in an arbitrary state, then the integrity of the sequential logic may be tested by scanning out the bits that were scanned in. As shown in FIG. 4, the test bits a, b, c, d and e that were scanned in are scanned out in the same order in which they were written into the flip-flops. As further shown in the figure, for scan out purposes alone, the scan input SI need not be used, and accordingly the loop control LC and the scan input SI may take on any value ("x"=don't care state) every Nth N-frequency clock cycle.

In general, the loop control word LC has the form $c_0 c_1 c_2 c_3 \ldots c_{N-1}$, where $c_0=1$ and $c_K=0$ for K=1, 2, ..., N-1. A loop control word of this form allows the state of the flip-flops to be read every base frequency clock cycle, while the flip-flops are simultaneously written with a predetermined test pattern. Of course, in a simpler implementation, the loop control input LC may be tied high to set the state if it is not desired to read the state simultaneously.

Thus, the base module 300 of the present invention allows the state of the sequential circuit to be written and read at base frequency even though the sequential components are clocked at a multiple of base frequency. As described below, this feature enables scan chain modules running at different multiples of base frequency to be concatenated to form a single scan chain.

Figure 5:
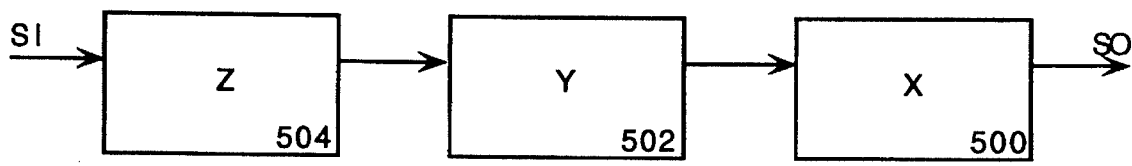
FIG. 5 illustrates a multi-frequency scan chain of the present invention.

FIG. 5 illustrates a multifrequency scan chain of the present invention. A first module 500 contains sequential elements running at a clock frequency multiple X with respect to base frequency. A second module 502 runs at a frequency multiple Y and a third module 504 runs at a multiple Z. Referring back to FIG. 4, that chart makes clear that the scan data output SO of module 500 will first consist of the original state of the flip-flops of module 500. The relationship of the sequential output to the original order of data in the flip-flops is given by the output ordering equation (1). These bits will be followed at the scan output by the pattern that was written into module 500 in the order in which those bits were written. Module 500 will first receive as an input the initial contents of module 502. The output of module 502 will follow the output ordering equation (1). Because the ordering from the output of module 502 to the output of module 500 is preserved, the initial contents of module 502 maintains the order determined by the output ordering equation when it reaches the scan data output SO. Module 500 next receives the input to module 502, which consists of the initial contents of module 504. The ordering of these bits also maintain the order provided by the output ordering equation (1) all the way through the modules until they reach the scan data output SO.

As the initial state of modules 500, 502 and 504 are observed, the tester may simultaneously write an arbitrary number of test bits into the scan chain to set the state of any or all of the flip-flops in the chain. If the tester wants to set the state of all the flip-flops in the modules, then the state of all flip-flops will be set by the time the initial contents of the last flip-flop 504 are observed. The ordering of the input test bits within each module is determined by the input ordering equation (2), where J is the base frequency clock cycle referenced to the first clock cycle in which a module receives the first bit to be stored in that module. In this manner, an arbitrary state may be written at base frequency into a single scan chain of sequential circuits clocked at different frequencies, and the state of the sequential circuit may be read at base frequency.

As mentioned above, the tester may then test the integrity of the flip-flops themselves by reading out the input test pattern. At the scan output SO, the test pattern bits should maintain the order in which they were written. Alternatively, the tester may run the combinational and sequential circuits together in normal mode for one or more base frequency clock cycles, and then read the state of the circuits.

Figure 6:
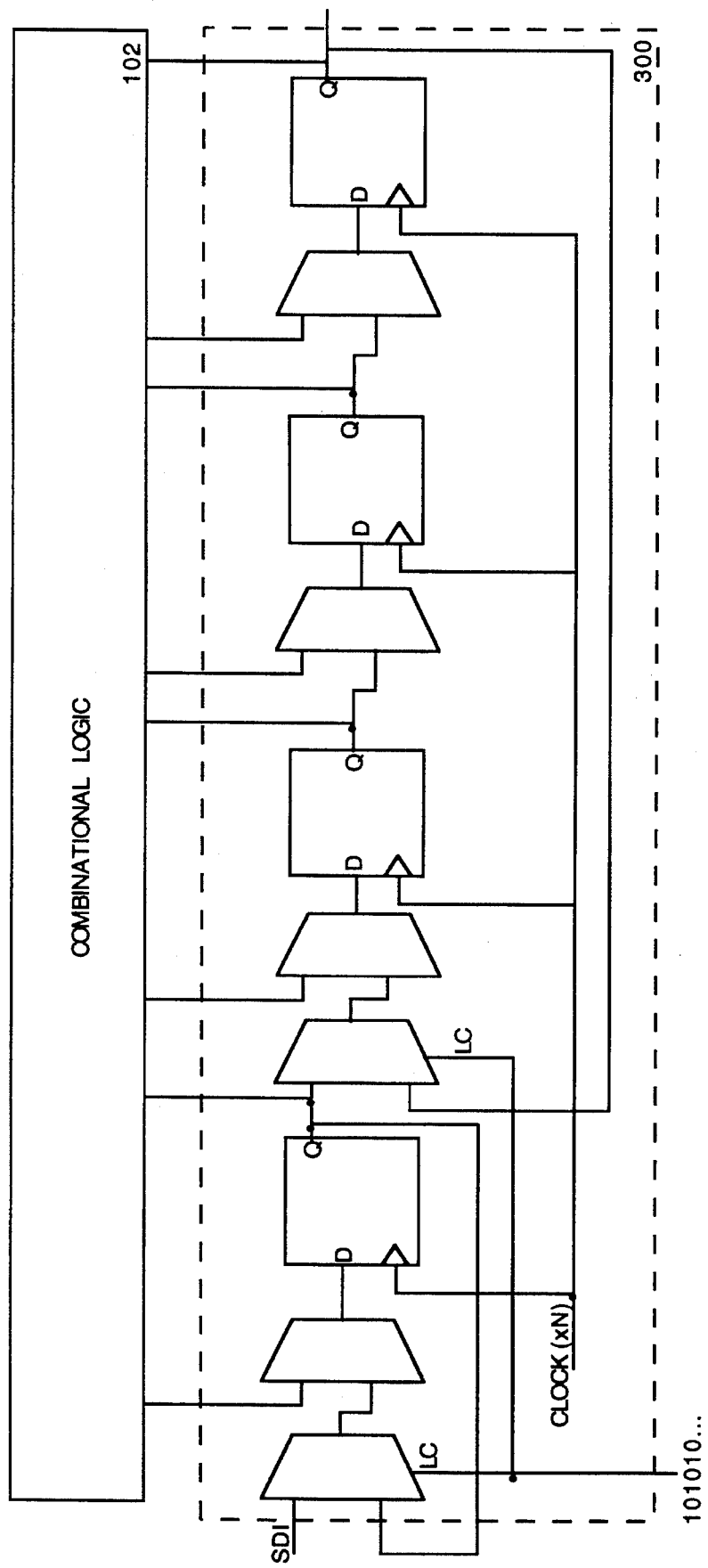
FIG. 6 illustrates the scan chain module of the present invention incorporating the loop splitting technique of the present invention.

In practice it may occur that the number of flip-flops M and the ratio N between the module frequency and the base frequency have a common divisor. This would violate the rule that M and N must be relative primes. To ensure compliance with this requirement, a base module can be split into two or more submodules that follow the relative prime rule. FIG. 6 shows how a base module 300 containing four flip-flops clocked with a double frequency clock can be divided into two submodules of three flip-flops and one flip-flop, respectively, so that each submodule contains a relative prime number of flip-flops with respect to the module frequency.

Figure 8:
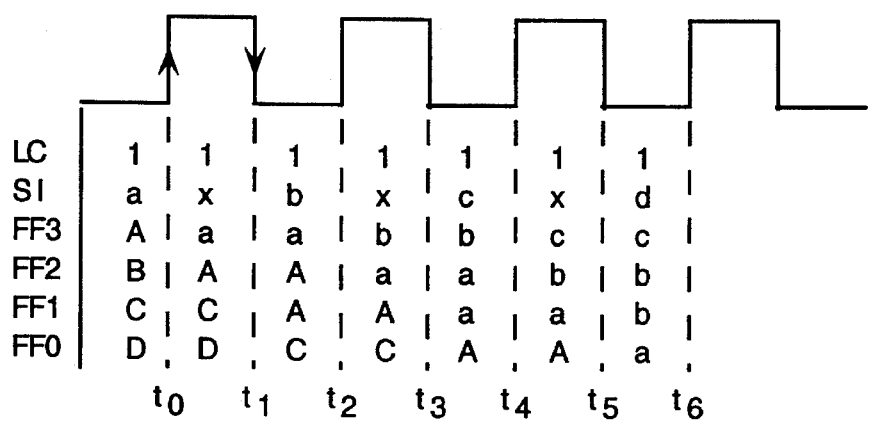
FIG. 8 is a timing chart of the module of FIG. 7.
Figure 7:
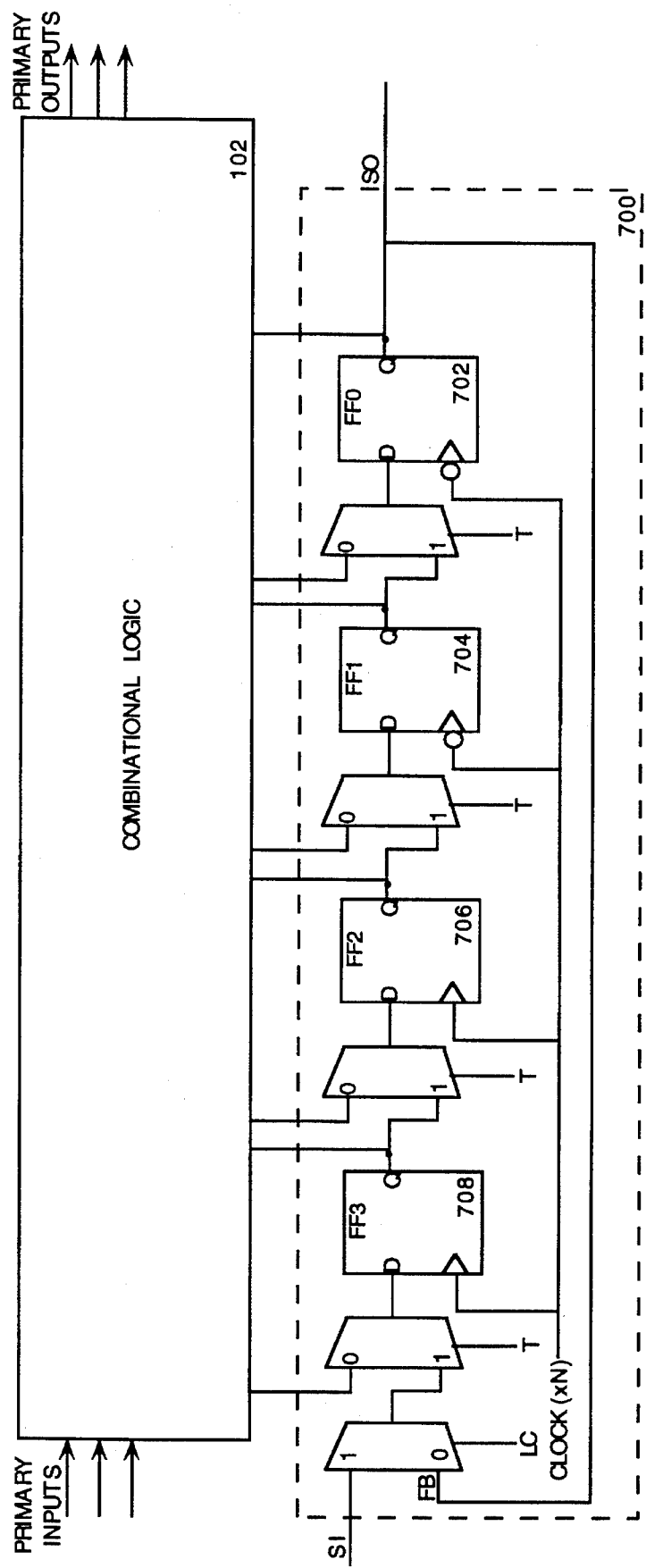
FIG. 7 illustrates a scan chain module exhibiting a leading-to-trailing phase transition.

The present invention also permits flip-flops clocked at different phases to be included in the same scan chain. The problems introduced by sequential components of differing phase is illustrated in the example of FIGS. 7 and 8. The base module 700 includes a scan chain of four flip-flops 702, 704, 706 and 708. Flip flops 708 and 706 are clocked on the rising edge of the N-frequency clock, while flip-flops 704 and 702 are clocked on the falling edge of the clock. To simplify the example, the module frequency is selected to be equal to the base frequency, i.e., N=1. Moreover, in this example, the circuit is triggered by the rising edge of the clock when it is first put into scan mode. Thus, in this case, the rising edge will be denoted the leading phase, and the falling edge will be called the trailing phase.

FIG. 8 demonstrates the problem encountered due to the leading-to-trailing phase transition between flip-flops 706 and 704. At time $t_0$ the contents of flip-flop 708 are shifted into flip-flop 706 on the rising edge of the clock. However, because flip-flop 704 is clocked on falling edges, the contents of flip-flop 706 are not shifted into flip-flop 704, and the state, represented by bit B, is lost. Thus, it will be impossible to observe the correct state of the scan chain.

Figure 9A:
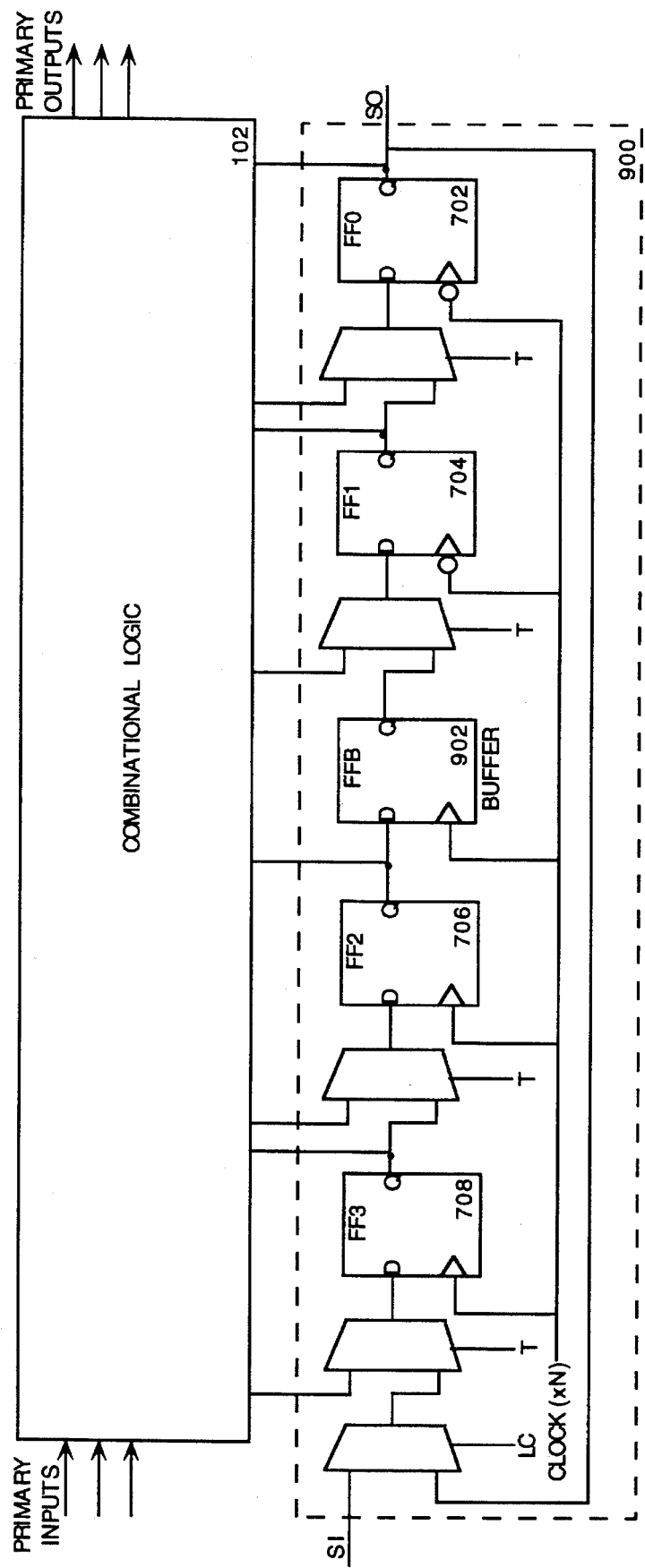
FIG. 9a illustrates a scan chain module of the present invention incorporating a phase buffer.
Figure 9B:
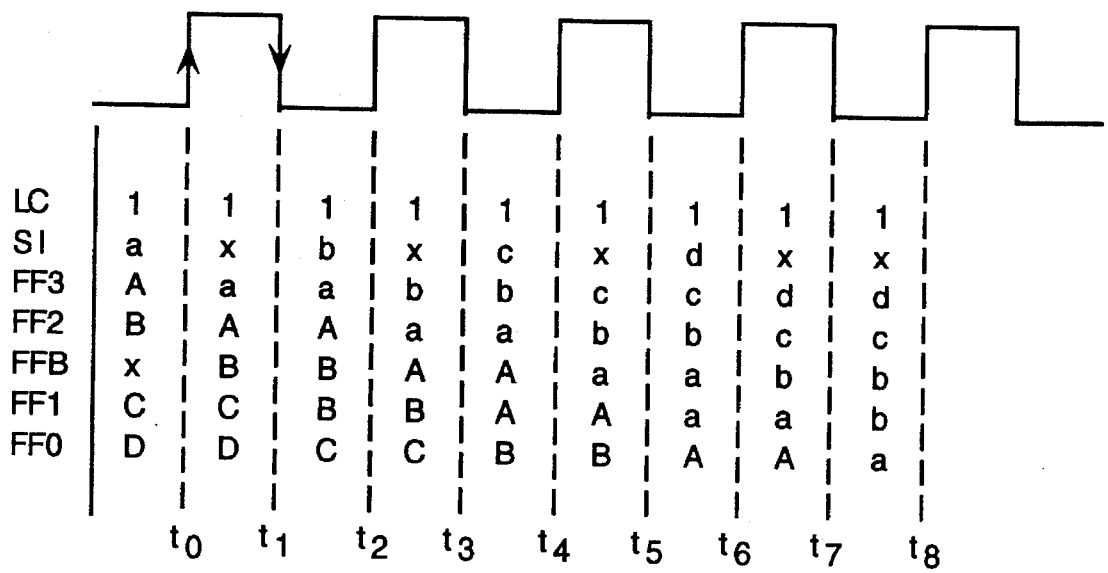

As shown in FIG. 9a, the base module 900 of the present invention solves this observability problem by introducing a buffer flip-flop 902 between the flip-flops 706 and 704 that exhibit the leading to trailing phase transition. The buffer flip-flop 902 is isolated from the combinational logic 102 and is only used during scan mode. In the general case of N≠1, the buffer flip-flop(s) are not counted as part of the M storage elements used in determining whether M and N are relative primes. As shown in the timing chart of FIG. 9b, during the rising edge at time $t_0$, the bit B is not lost because it is buffered in buffer 902 at that time.

Using the present invention a buffer may also be interposed between any two flip-flops in which the clock line delay is the equivalent of a leading-to-trailing phase transition.

Figure 10B:
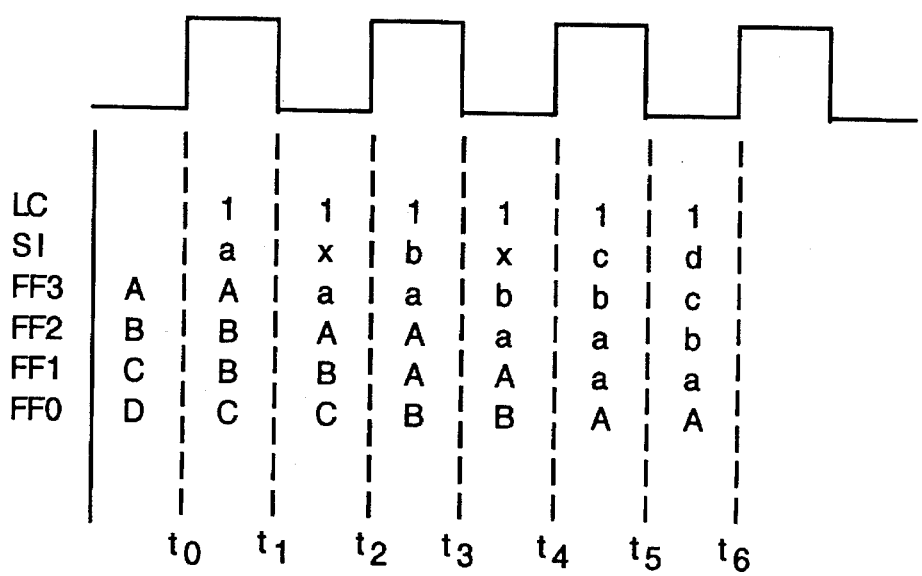
Figure 10A:
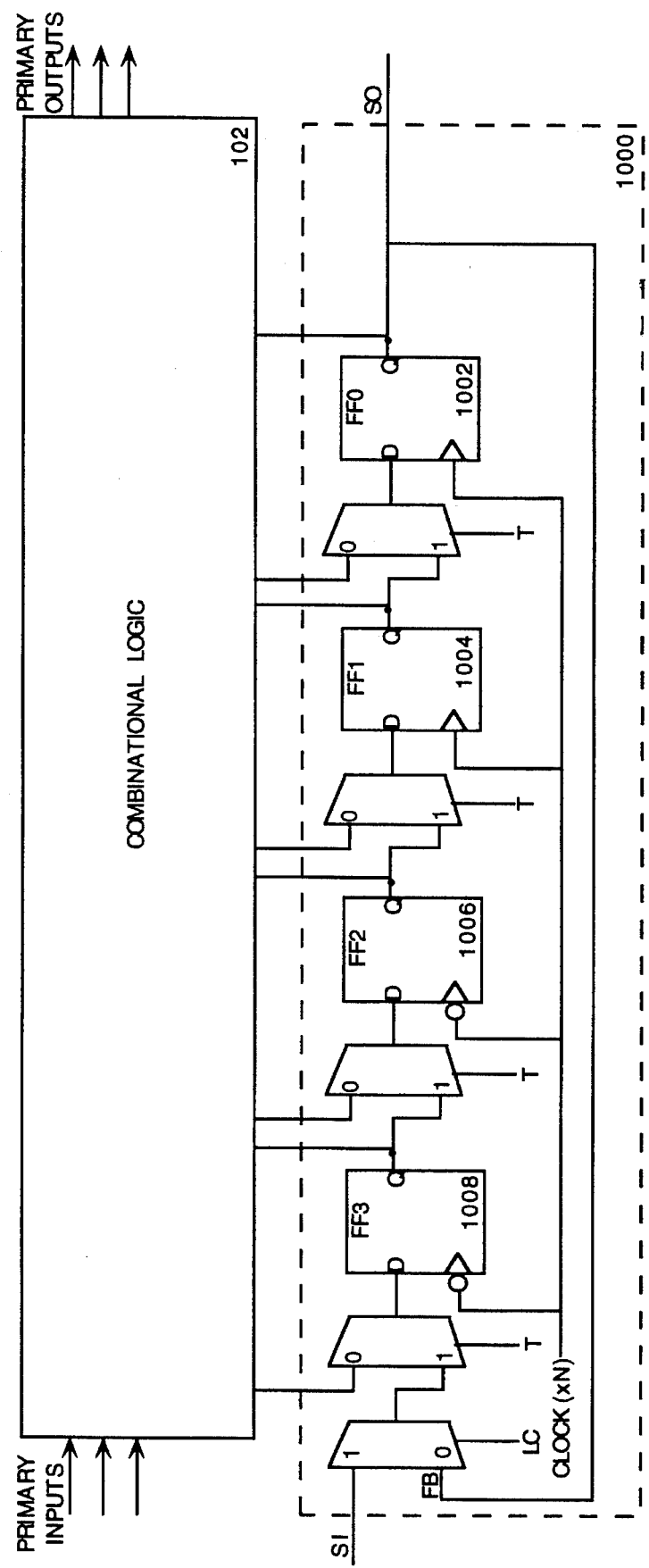
FIG. 10a illustrates a scan chain module exhibiting a trailing-to-leading phase transition.

Note that a buffer is not necessary to correct a trailing-to-leading phase transition because data is not lost in that case. FIG. 10a illustrates a scan chain base module 1000 including four flip-flops 1008, 1006, 1004 and 1002. Flip flops 1008 and 1006 are clocked on the trailing edge of the clock, while flip-flops 1004 and 1002 are clocked on the rising edge. As shown in FIG. 10b, on the rising edge occurring at time $t_0$, the state of flip-flops 1008 and 1006 remain the same, while the state of flip-flop 1006 is shifted into flip-flop 1004. Because the state transition is in a trailing-to-leading phase direction, the state of flip-flop 1006 is preserved by being shifted into flip-flop 1004 on the rising edge. Thus, no data is lost and no buffer is necessary in a trailing phase to leading phase scan chain configuration.

It follows that where the leading phase occurs on the falling edge of the clock, i.e., the first clock edge encountered in scan mode is a falling edge, the buffer introduced between two flip-flops exhibiting a phase transition must be clocked by the falling edge of the clock. The circuit is also generalized by inserting a buffer wherever a leading-to-trailing phase transition occurs, including in the feedback loop between the last flip-flop and the first flip-flop within a scan chain module and between the last flip-flop of one module and the first flip-flop of another module, if necessary.

Note that in FIG. 10a a buffer will generally be necessary in the feedback path because the connection from flip-flop 1002 to flip-flop 1008 exhibits a leading-to-trailing phase interface. However, for the sake of simplicity the example of FIG. 10b shows the scan chain of FIG. 10a being run at base frequency, in which case a buffering flip-flop is not necessary in the feedback loop.

Although the invention has been described in conjunction with preferred embodiments, it will be appreciated that various modifications and alterations may be made by those skilled in the art without departing from the spirit and scope of the invention. In particular, the logic circuitry described herein, such as the multiplexers and flip-flops, may be implemented using equivalent circuitry known in the art.

What is claimed is:

1. A method of scanning the $M_1$ storage elements of a first circuit at a first clock rate and the $M_2$ storage elements of a second circuit at a second clock rate, comprising:

interconnecting said $M_1$ storage elements so as to form a first scan chain with a first storage element and a last storage element;

clocking said first scan chain at $N_1$ times a base frequency where $M_1$ and $N_1$ are relatively prime;

interconnecting said $M_2$ storage elements so as to form a second scan chain with a first storage element and a last storage element;

clocking said second scan chain at $N_2$ times said base frequency where $M_2$ and $N_2$ are relatively prime;

operating, during certain clock cycles, said first and second scan chains in a concatenate scan chain mode in which the output of said last storage element of said first scan chain is coupled to the input of said first storage element of said second scan chain; and operating, during other clock cycles, said first and second scan chains in a feedback loop mode in which the output of said last storage element of said first scan chain is coupled to the input of said first storage element of said first scan chain and the output of said last storage element of said second scan chain is coupled to the input of said first storage element of said second scan chain.

2. The method according to claim 1 wherein said first and second scan chains operate in said concatenate scan chain mode for one clock cycle during each base frequency period and in said feedback loop mode otherwise.

3. An apparatus for scanning the $M_1$ storage elements of a first circuit operable at a first clock rate and the $M_2$ storage elements of a second circuit operable at a second clock rate, comprising:

a first scan chain, comprising said $M_1$ storage elements of said first circuit interconnected so as to form said first scan chain with a first storage element and a last storage element, said first scan chain being clocked at $N_1$ times a base frequency where $M_1$ and $N_1$ are relatively prime;

a second scan chain, comprising said $M_2$ storage elements of said second circuit interconnected so as to form said second scan chain with a first storage element and a last storage element, said second scan chain being clocked at $N_2$ times a base frequency where $M_2$ and $N_2$ are relatively prime;

a scan control circuit, coupled to said first and second scan chains, operable in a feedback loop mode to couple the output of said last storage element of said first scan chain to the input of said first storage element of said first scan chain and to couple the output of said last storage element of said second scan chain to the input of said first storage element of said second scan chain, and further operable in a concatenate scan chain mode to couple the output of said last storage element of said first scan chain to the input of said first storage element of said second scan chain.

4. The apparatus according to claim 3, wherein said apparatus is operable in a scan mode during which said scan control circuit is in said concatenate scan chain mode for one clock cycle during each base frequency period and in said feedback loop mode otherwise.

5. The apparatus according to claim 3, wherein the storage elements in said first scan chain are operable in a normal mode to function as part of said first circuit and in a scan mode to shift their contents to the next storage element in said first scan chain.

6. The apparatus according to claim 3, wherein the storage elements in said second scan chain are operable in a normal mode to function as part of said second circuit and in a scan mode to shift their contents to the next storage element in said second scan chain.

7. The apparatus according to claim 3, further comprising:

a buffer storage element, operable to receive the value of a first predetermined one of said storage elements in said first scan chain, and to provide said value to a second predetermined one of said storage elements in said first scan chain, said buffer storage element and all storage elements preceeding said buffer in said first scan chain being clocked on the leading phase of a scan clock; and all storage elements following said buffer in said first scan chain being clocked on the trailing phase of said scan clock.

8. The apparatus according to claim 3, further comprising:

a buffer storage element, operable to receive the value of a first predetermined one of said storage elements in said second scan chain, and to provide said value to a second predetermined one of said storage elements in said second scan chain, said buffer storage element and all storage elements preceeding said buffer in said second scan chain being clocked on the leading phase of a scan clock; and all storage elements following said buffer in said second scan chain being clocked on the trailing phase of said scan clock.

9. A method of scanning the $M_1$ storage elements of a first circuit at a first clock rate and the $M_x$ storage elements of a second circuit at a second clock rate, comprising:

interconnecting said $M_1$ storage elements so as to form a first scan chain with a first storage element and a last storage element;

clocking said first scan chain at $N_1$ times a base frequency where $M_1$ and $N_1$ are relatively prime;

interconnecting $M_2$ of said $M_x$ storage elements so as to form a second scan chain with a first storage element and a last storage element;

clocking said second scan chain at $N_2$ times said base frequency where $M_2$ and $N_2$ are relatively prime;

interconnecting $M_3$ of said $M_x$ storage elements so as to form a third scan chain with a first storage element and a last storage element, where $M_2$ plus $M_3$ equals $M_x$;

clocking said third scan chain at $N_2$ times said base frequency where $M_3$ and $N_2$ are relatively prime;

operating, during certain clock cycles, said first and second scan chains in a concatenate scan chain mode in which the output of said last storage element of said first scan chain is coupled to the input of said first storage element of said second scan chain; and operating, during other clock cycles, said first and second scan chains in a feedback loop mode in which the output of said last storage element of said first scan chain is coupled to the input of said first storage element of said first scan chain and the output of said last storage element of said second scan chain is coupled to the input of said first storage element of said second scan chain.

10. The method according to claim 9, wherein said first, second and third scan chains operate in said concatenate scan chain mode for one clock cycle during each base frequency period and in said feedback loop mode otherwise.

11. An apparatus for scanning the $M_1$ storage elements of a first circuit operable at a first clock rate and the $M_x$ storage elements of a second circuit operable at a second clock rate, comprising:

a first scan chain, comprising said $M_1$ storage elements of said first circuit interconnected so as to form said first scan chain with a first storage element and a last storage element, said first scan chain being clocked at $N_1$ times a base frequency where $M_1$ and $N_1$ are relatively prime;

a second scan chain, comprising $M_2$ of said $M_x$ storage elements of said second circuit interconnected so as to form said second scan chain with a first storage element and a last storage element, said second scan chain being clocked at $N_2$ times a base frequency where $M_2$ and $N_2$ are relatively prime and $M_2$ plus $M_3$ equals $M_x$;

a third scan chain, comprising said $M_3$ of said storage elements of said second circuit interconnected so as to form said third scan chain with a first storage element and a last storage element, said third scan chain being clocked at $N_2$ times a base frequency where $M_3$ and $N_2$ are relatively prime;

a scan control circuit, coupled to said first, second and third scan chains, operable in a feedback loop mode to couple the output of said last storage element of said first scan chain to the input of said first storage element of said first scan chain, to couple the output of said last storage element of said second scan chain to the input of said first storage element of said second scan chain, and to couple the output of said last storage element of said third scan chain to the input of said first storage element of said third scan chain, and further operable in a concatenate scan chain mode to couple the output of said last storage element of said first scan chain to the input of said first storage element of said second scan chain and to couple the output of said last storage element of said second scan chain to the input of said first storage element of said third scan chain.

12. The apparatus according to claim 11, wherein said apparatus is operable in a scan mode during which said scan control circuit is in said concatenate scan chain mode for one clock cycle during each base frequency period and in said feedback loop mode otherwise.

13. The apparatus according to claim 11, wherein the storage elements in said first scan chain are operable in a normal mode to function as part of said first circuit and in a scan mode to shift their contents to the next storage element in said first scan chain.

14. The apparatus according to claim 11, wherein the storage elements in said second scan chain are operable in a normal mode to function as part of said second circuit and in a scan mode to shift their contents to the next storage element in said second scan chain.

15. The apparatus according to claim 11, wherein the storage elements in said third scan chain are operable in a normal mode to function as part of said second circuit and in a scan mode to shift their contents to the next storage element in said third scan chain.

16. The apparatus according to claim 11, further comprising:

a buffer storage element, operable to receive the value of a first predetermined one of said storage elements in said first scan chain, and to provide said value to a second predetermined one of said storage elements in said first scan chain, said buffer storage element and all storage elements preceeding said buffer in said first scan chain being clocked on the leading phase of a scan clock; and all storage elements following said buffer in said first scan chain being clocked on the trailing phase of said scan clock.

17. The apparatus according to claim 11, further comprising:
- a buffer storage element, operable to receive the value of a first predetermined one of said storage elements in said second scan chain, and to provide said value to a second predetermined one of said storage elements in said second scan chain,
- said buffer storage element and all storage elements preceeding said buffer in said second scan chain being clocked on the leading phase of a scan clock; and
- all storage elements following said buffer in said second scan chain being clocked on the trailing phase of said scan clock.

18. The apparatus according to claim 11, further comprising:
- a buffer storage element, operable to receive the value of a first predetermined one of said storage elements in said third scan chain, and to provide said value to a second predetermined one of said storage elements in said third scan chain,
- said buffer storage element and all storage elements preceeding said buffer in said third scan chain being clocked on the leading phase of a scan clock; and
- all storage elements following said buffer in said third scan chain being clocked on the trailing phase of said scan clock.

* * * * *

UNITED STATES PATENT AND TRADEMARK OFFICE
CERTIFICATE OF CORRECTION

PATENT NO. : 5,504,756
DATED : April 2, 1996
INVENTOR(S) : Kim et al.

It is certified that error appears in the above-indentified patent and that said Letters Patent is hereby corrected as shown below:

In column 2 at line 10 delete "dock" and insert --clock--

In column 2 at line 26 delete "docked" and insert --clocked--

In column 2 at line 26 delete "dock" and insert --clock--

In column 5 at line 28 delete "dock" and insert --clock--

In column 5 at line 36 delete "dock" and insert --clock--

In column 5 at line 53 delete "dock" and insert --clock--

UNITED STATES PATENT AND TRADEMARK OFFICE
CERTIFICATE OF CORRECTION

PATENT NO. : 5,504,756
DATED : April 2, 1996
INVENTOR(S) : Kim et al

It is certified that error appears in the above-indentified patent and that said Letters Patent is hereby corrected as shown below:

In column 6 at line 61 delete "docked" and insert --clocked--

In column 6 at line 63 delete "dock" and insert --clock--

In column 6 at line 66 delete "dock" and insert --clock--

Signed and Sealed this

Twenty-ninth Day of October 1996

Attest:

BRUCE LEHMAN

*Attesting Officer*    Commissioner of Patents and Trademarks